United States Patent [19]

Takahashi et al.

[11] Patent Number: 4,887,026
[45] Date of Patent: Dec. 12, 1989

[54] VOLTAGE DETECTOR FOR DETECTING A VOLTAGE DEVELOPING IN A SELECTED AREA OF AN OBJECT

[75] Inventors: Hironori Takahashi; Yutaka Tsuchiya; Shinichiro Aoshima, all of Shizuoka, Japan

[73] Assignee: Hamamatsu Photonics Kabushiki Kaisha, Shizuoka, Japan

[21] Appl. No.: 201,888

[22] Filed: Jun. 3, 1988

[30] Foreign Application Priority Data

Jun. 5, 1987 [JP] Japan ................................ 62-142063

[51] Int. Cl.$^4$ ................... G01R 19/00; G01R 19/155
[52] U.S. Cl. ...................................... 324/96; 350/413
[58] Field of Search .................. 324/96, 117 R, 77 K; 337/7; 455/600, 614; 350/356, 370, 374; 370/1, 2; 356/368, 394

[56] References Cited

U.S. PATENT DOCUMENTS

| | | | |
|---|---|---|---|
| 4,327,963 | 5/1982 | Khoe et al. | 350/413 |
| 4,364,639 | 12/1982 | Sinclair et al. | 350/413 |
| 4,446,425 | 5/1984 | Valdmanis et al. | 324/77 K |
| 4,603,293 | 7/1986 | Mourou et al. | 324/96 |
| 4,618,819 | 10/1986 | Mourou et al. | 324/77 K |
| 4,762,403 | 8/1988 | Hattori | 350/413 |

FOREIGN PATENT DOCUMENTS 0197196  10/1986  European Pat. Off. .

OTHER PUBLICATIONS

Williamson, S. et al., "Picosecond Electro-Electron Optic Oscilloscope", Proc. Conf. Picosecond Electron. Optoelectron., pp. 58–61, (N.Y. Springer-Verlar), 1985.
Kolner, B. H. et al., "Electrooptic Sampling in GaAs Intergated Circuits", IEEE Journal of Quantum Electronics, vol. qe-22, pp. 79–93, Jan. 1987.
Nees, J. et al., "Noncontact Electro-Optic Sampling with a GaAs Injection Laser", Electronics Letters, vol. 22, No. 17, pp. 918–919, Aug. 1986.
Valdmanis, J. A. et al., "Electro-Optic Sampling: Testing Picosecond Electronics Part 1, Principles and Embodiments", Laser Focus/Electro-Optics, pp. 84–86, Feb. 1986.
Valdmanis, J. A. et al., "Electro-Optic Sampling: Testing Picosecond Electronics Part 2. Applications", Laser Focus/Electro-Optics, pp. 96–106, Mar. 1986.
Valdmanis, J. A. et al., "Subpicosecond Electrical Sampling and Applications", Picosecond Optoelectronic Devices, pp. 249–270, 1984.
Valdmanis, J. A. et al., "Subpicosecond Electrooptic Sampling: Principles and Applications", IEEE Journal of Quantum Electronics, vol. qe-22, No. 1, pp. 69–78, Jan. 1986.
Valdmanis, J. A. et al., "Picosecond Electrooptic Sampling System", Appl. Phys. Lett., vol. 41, No. 3, pp. 211–212, Aug. 1982.
Valdmanis, J. A. et al., "Subpicosecond Electrical Sampling", IEEE Journal of Quantum Electronics, vol. qe-19, No. 4, pp. 664–667, Apr. 1983.
Kolner, B. H. et al., "Electro-optic Sampling with Picosecond Resolution", Electronics Letters, vol. 19, No. 15, pp. 574–575, Jul. 1983.
Tsuchiya, Y., "Advances in Streak Camera Instrumentation for the Study of Biological and Physical Processes", IEEE Journal of Quantum Electronics, vol. qe-20, No. 12, pp. 1516–1528, Dec. 1984.
Valdmanis, J. A., "High-Speed Optical Electronics: The Picosecond Optical Oscilloscope", Solid State Technology/Test and Measurement World, pp. S40–S44, Nov. 1986.

Primary Examiner—Reinhard J. Eisenzopf
Assistant Examiner—W. Burns
Attorney, Agent, or Firm—Finnegan, Henderson, Farabow, Garrett and Dunner

[57] ABSTRACT

A voltage detector detects a voltage developing in a selected area of an object such as an integrated circuit by utilizing an electro-optic material equipped in an optical probe. A change in refractive index of the electro-optic material hwich is caused by the voltage in the object, is detected as a change of polarization of a light beam passing through the electro-optic material. In order to simplify the optical system, the electro-optic material itself has a function to change the light-traveling path. In the first aspect, a surface of light-incidence side is worked into a lens shape. In the second aspect, the electro-optic material has a graded refractive index profile as a result of ion diffusion.

14 Claims, 3 Drawing Sheets

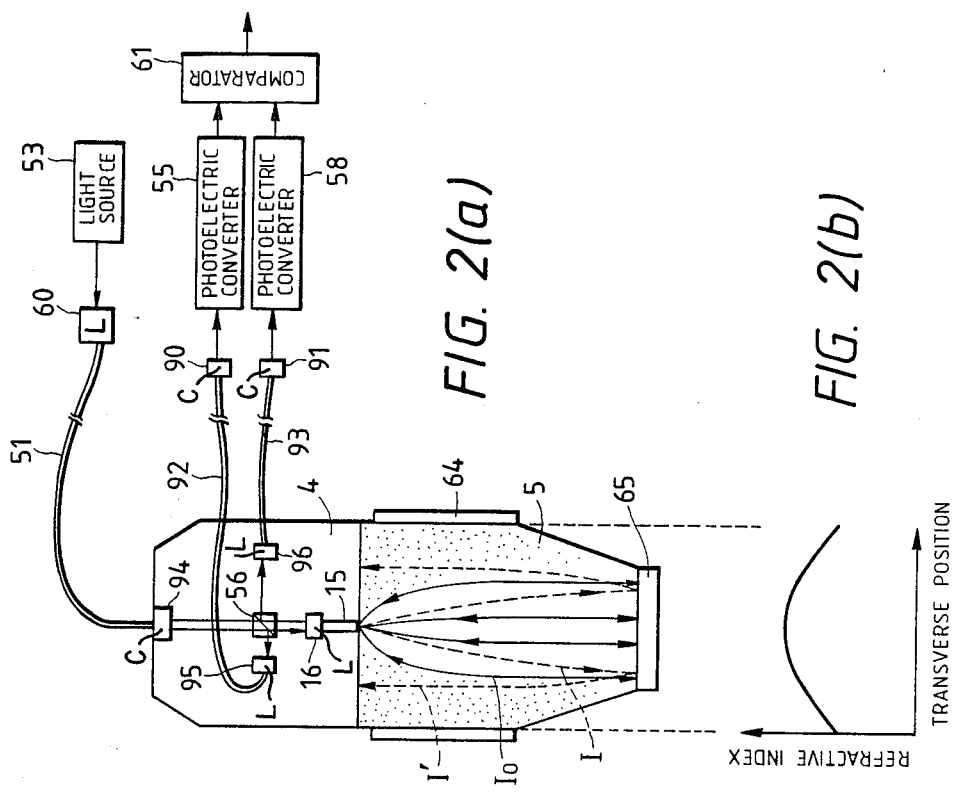
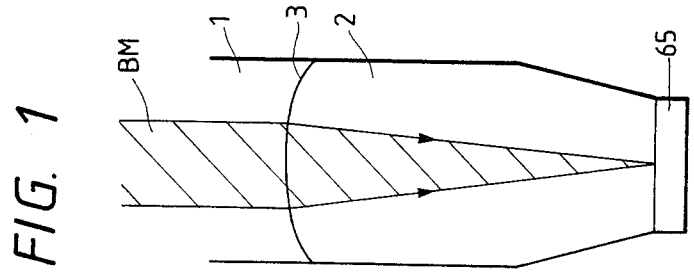

VOLTAGE DETECTOR FOR DETECTING A VOLTAGE DEVELOPING IN A SELECTED AREA OF AN OBJECT

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong need exists in the art for detecting such rapidly changing voltage with high precision without affecting the fine-line portions. However, this need has not been fully met by the prior art voltage detectors. With devices of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed at that. In addition, the area to be measured is prone to be damaged by electron beams.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by two of the present inventors (Japanese patent application No. 137317/1987 filed on May 30, 1987) that voltage be detected by making use of the polarization of a light beam that changes with the voltage developing in a selected area of an object to be measured.

A voltage detector operating on this principle is schematically shown in FIG. 5. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 via a condenser lens 60; an optical fiber 92 for guiding reference light from the optical probe 52 into a photoelectric converter 55 via a collimator 90; an optical fiber 93 for guiding output light from the optical probe 52 into a photoelectric converter 58 via a collimator 91; and a comparator circuit 61 for comparing the electric signals form the photoelectric converters 55 and 58.

The optical probe 52 is filled with an electro-optic material 62 such as an optically uniaxial crystal of lithium tantalate ($LiTaO_3$) The tip 63 of the electro-optic material 62 is worked into a frustoconical shape. The optical probe 52 is surrounded with a conductive electrode 64 and has at its tip 63 a coating of reflecting mirror 65 in the form of a thin metal film or a multilayered dielectric film.

The optical probe 52 further includes the following components: a collimator 94; condenser lenses 95 and 96; a polarizer 54 for selectively extracting a light beam having a predetermined polarized component from the light beam passing through the collimator 94; and a beam splitter 56 that splits the extracted light beam from the polarizer 54 into reference light and input light to be launched into the electro-optic material 62 and which allows the output light emerging from the electro-optic material 62 to be directed into an analyzer 57. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 5 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94 in the optical probe 52. The beam is polarized by the polarizer 54 and a predetermined polarized component having intensity I is launched into the electro-optic material 62 in the optical probe 52 via the beam splitter 56. Each of the reference light and the input light, which are produced by passage through the beam splitter 56, has an intensity of I/2. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in the refractive index of the latter. The input light is then reflected from the reflecting mirror 65 and makes a return trip through the electro-optic material 62, from which it emerges and travels back to the beam splitter 56. If the length of the tip 63 of the electro-optic material 62 is written as l, the state of polarization of input light launched into that material will change in proportion to the difference between refractive indices for an ordinary ray and an extraordinary ray and to the length 21 as well. The output light sent back into the beam splitter 56 is thence directed into the analyzer 57. The intensity of the output light entering the analyzer 57 has been decreased to I/4 as a result of splitting with the beam splitter 56. If the analyzer 57 is designed in such a way as to transmit only a light beam having a polarized component perpendicular to that extracted by the polarizer 54, the intensity of output light that is fed into the analyzer 57 after experiencing a change in the state of its polarization is changed from I/4 to $(I/4)\sin^2[(\pi/2)V/V_o]$ in the analyzer 57 before it is further fed into the photoelectric converter 58. In the formula expressing the intensity of output light emerging from the analyzer 57, V is the voltage developing in the object to be measured, and $V_o$ is a half-wave voltage.

In the comparator circuit 61, the intensity of reference light produced from the photoelectric converter 55, or I/2, is compared with the intensity of output light produced from the other photoelectric converter 58, or $(I/4)\sin^2[(\pi/2)V/V_o]$.

The intensity of output light, or $(I/4)\sin^2[(\pi/2)V/V_o]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 5, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage being measured can be effectively detected by the detector 50 without bringing the optical probe 52 into contact with such fine-line portions. If desired, a pulse light source such as a laser diode that produces light pulses of a very small pulse width may be used as a light source to ensure that rapid changes in the voltage on the object to be measured are sampled at extremely short time intervals. Rapid changes in the voltage on the object of interest can be measured with a very high time resolution by using a CW light source and a quick-response detector such as a streak camera. Either method is capable of precision detection of rapid changes in voltage.

In the voltage detector 50 shown in FIG. 5, the light beam BM issuing from the light source 53 is converged by a condenser lens (not shown n FIG. 5 but shown in FIG. 6 by 70) and launched into the electro-optic material 62. However, the addition of the condenser lens 70 increases the number of components of the optical system and the adjustment of the latter becomes too complicated to ensure high reliability.

SUMMARY OF THE INVENTION

An object, therefore, of the present invention is to provide a voltage detector capable of reliable detection of the voltage developing in a selected area of an object of interest with a simpler optical system.

In accordance with the present invention, the electro-optic material used in the voltage detector has the ability to change the optical path of a light beam launched into said material. In the first aspect of the invention, the surface of the light-incidence side of the electro-optic material is worked into a lens shape. In the second aspect of the invention, the electro-optic material has a graded refractive index profile as a result of ion diffusion.

Other and further objects, features and advantages of the invention will appear more fully from the following description taken in connection with the accompanying drawings.

BRIEF DESCRIPTION OF THE DRAWINGS

FIG. 1 is a diagram showing schematically a part of the composition of a voltage detector according to the first embodiment of the present invention;

FIG. 2(*a*) is a diagram showing schematically the composition of a voltage detector according to the second embodiment of the invention;

FIG. 2(*b*) is a diagram showing a refractive index profile of an electro-optic material used in the voltage detector shown in FIG. 2(*a*);

DETAILED DESCRIPTION OF THE INVENTION

Various embodiments of the present invention are described hereinafter with reference to the accompanying drawings.

Figure 5:
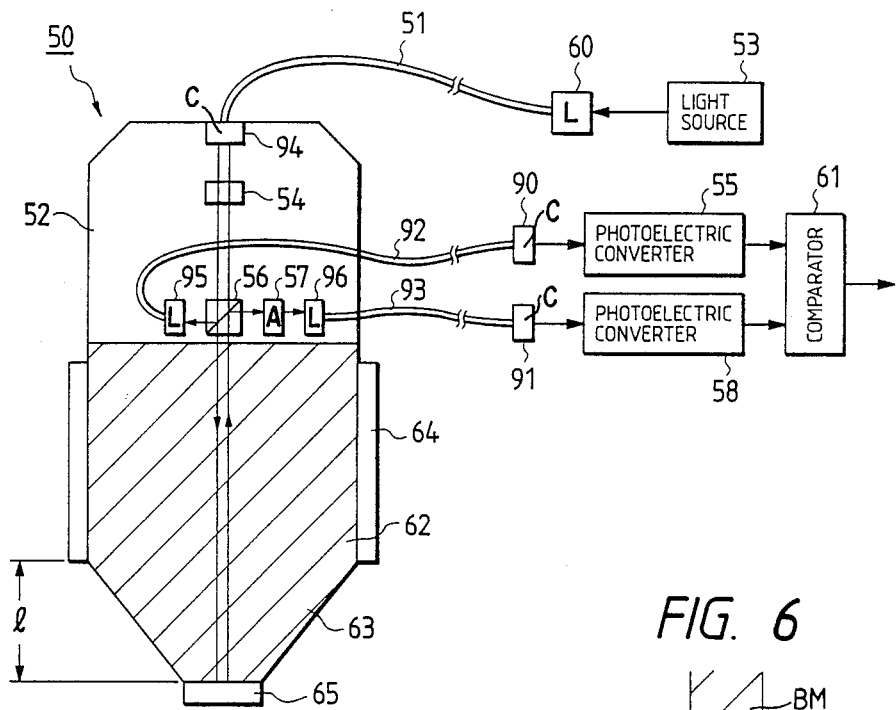
FIG. 5 is a diagram showing the composition of a voltage detector having been proposed in Japanese patent application No. 137317/1987.

FIG. 1 is a diagram showing schematically a part of the composition of a voltage detector according to the first embodiment of the present invention. Other parts of the voltage detector are same as those shown in FIG. 5.

In the voltage detector shown in FIG. 1, an optical probe 1 contains an electro-optic material 2 and an input light beam BM falls on a surface 3 which is worked into a convex shape. The surface 3 may be so shaped that the light beam BM launched into the electro-optic material 2 will be focused at a point on a reflection mirror 65 in the form of a thin metal film or a multilayered dielectric film.

Figure 6:
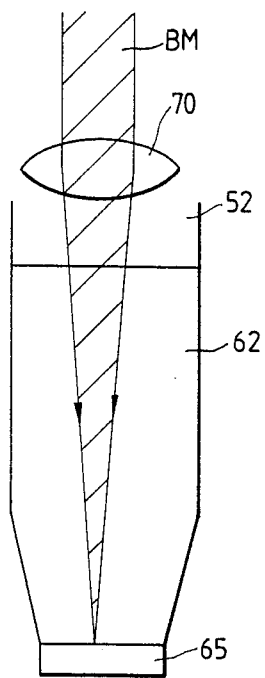
FIG. 6 is a diagram showing schematically a part of a voltage detector using a condenser lens.

With the composition described above, the input light beam BM introduced to the surface 3 of the electro-optic material 2 is converged by the material 2 itself and reaches the reflection mirror 65, from which it is reflected to travel back through the material 2 and thereafter emerges from the surface 3. Since the light beam BM launched into the electro-optic material 2 is converged by the material itself, there is no need to provide a separate condenser lens as shown by 70 in FIG. 6 and the number of components in the optical system can be sufficiently reduced to ensure improved reliability.

FIG. 2(*a*) is a diagram showing schematically the composition of a voltage detector according to the second embodiment of the present invention.

In the voltage detector shown in FIG. 2(*a*), ions, e.g. alkali metal ions, are diffused in an electro-optic material 5 in an optical probe 4 to make the material 5 itself a lens with graded refractive index profile. The refractive index profile of the electro-optic material 5 as a function of a position in the transverse direction is graded as shown in FIG. 2(b). Reference numerals 15 and 16 are an optical fiber and a condenser lens, respectively.

In the voltage detector having the composition described above, a light beam BM issuing from a light source travels through an optical fiber 15 and is launched into the electro-optic material 5 in the optical probe 4. The launched light beam BM is refracted by the electro-optic material 5 serving as a lens with graded refractive index profile and travels until it reaches the reflection mirror 65. In the absence of any voltage applied to the electro-optic material 5, the launched light beam BM falls on the reflection mirror 65 vertically and travels back on the same path after reflection from this mirror, for example along a path $I_0$. The light beam BM then emerges from the electro-optic material 5. Therefore, the detected output light has substantially the same intensity as the input light. When a voltage developing in a selected area of an object is applied to the electro-optic material 5 in FIG. 2(a), the refractive index profile of the electro-optic material 5 is changed. In the case of the electro-optic material 5 with the graded refractive index profile, a new phenomenon of a change in a light-traveling path on account of the voltage application is obtained, as well as the change in polarization. The second embodiment of the invention utilizes this change in the light-traveling path. That is, when the voltage developing in the object to be detected is applied, the refractive index profile of the electro-optic material 5 is changed, so that the launched light beam travels through the material 5 for example along an optical path I indicated by a dashed line in FIG. 2(a) and then reaches the reflection mirror 65. In this case, the light beam BM does not encounter the reflection mirror 65 perpendicularly to its surface, so the reflected light travels on a different path I' and emerges from the electro-optic material 65. As a result, the detected output light (signal light) has a smaller intensity than the input light and the voltage developing in a selected area of the object of interest can be detected by examining the intensity of the output light.

In the second embodiment described above, the voltage developing in a selected area of the object to be measured is not detected by using the change in the state of polarization of the light beam BM but by directly measuring the change in the intensity, or quantity, of the light beam BM. Therefore, in addition to the elimination of the condenser lens 70 shown in FIG. 6, the polarizer 54 and the analyzer 57 shown in FIG. 5 can also be eliminated and an optical system even simpler than that employed in the first embodiment can be realized.

Figure 3:
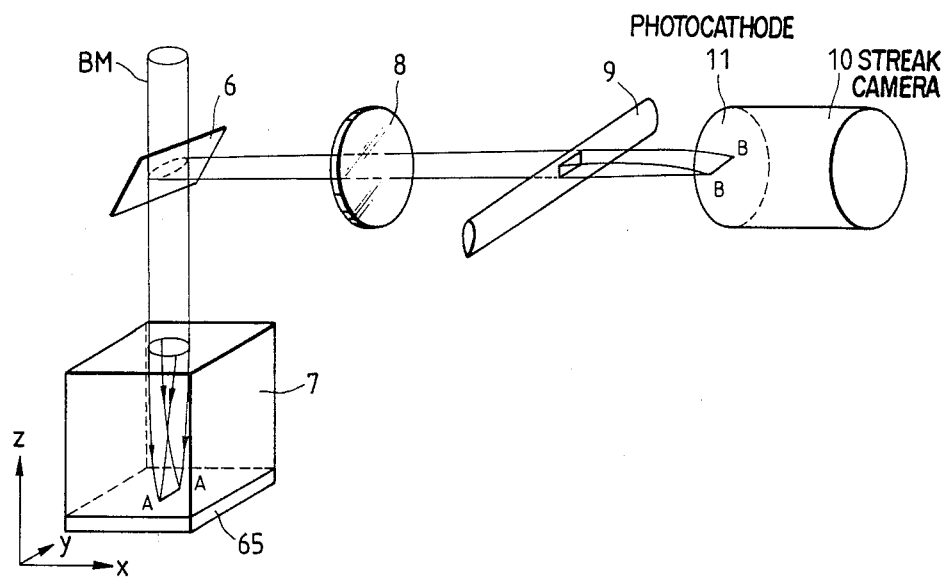
FIG. 3 is a diagram showing the composition of a voltage detector according to the third embodiment of the invention.

FIG. 3 is a diagram showing the composition of a voltage detector according to the third embodiment of the present invention.

Figure 4A:
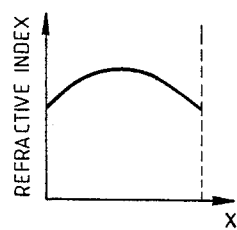
FIGS. 4(*a*), 4(*b*) and 4(*c*) are diagrams showing the refractive index profiles of the electro-optic material used in the voltage detector shown in FIG. 3, with the respective profiles being taken on x-, y- and z-axes.
Figure 4B:
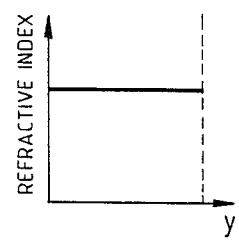
Figure 4C:
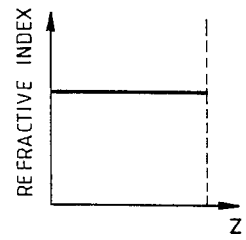

In the voltage detector shown in FIG. 3, a light beam BM passes through a beam splitter 6 (or half-mirror) before it is launched into an electro-optic material 7 serving as a lens with graded refractive index profile. The electro-optic material 7 has a unidirectional (x-axis) refractive index profile as is apparent from the graphs shown in FIGS. 4(a) to 4(c). Therefore, the light beam BM launched into the electro-optic material 7 is converged on the reflection mirror 65 along a straight line indicated by A—A. The linearly converged light beam BM is reflected from the mirror 65 and emerges from the electro-optic material 7 and thence passes through the beam splitter 6, an analyzer 8 and a cylindrical lens 9 to be converged on the photocathode 11 of a streak camera 10 along a straight line indicated by B—B. In other words, the light beam converged in the electro-optic material 7 along the line indicated by A—A is projected on to the photocathode 11 of the streak camera 10 along the line indicated by B—B. Since the line B—B in the photocathode 11, along which the light beam is projected on, is perpendicular to the sweep direction of the streak camera 10, the voltage change in the one-dimensional area of the object of interest lying beneath the reflection mirror 65 can be measured in an extremely short period with the streak camera 10.

When a streak camera is used as the detector in the foregoing embodiments, it is sometimes the case that the reference light is not used.

In the embodiments described above, the light beam BM is converged on the reflection mirror 65 but part of the light beam BM might fall on the surface of the optical probe 1 or 4 to be scattered by reflection. Such scattering light will lower the precision of voltage detection and should desirably be eliminated. To this end, a coat of a suitable anti-reflection material such as a black paint may be formed on an inner surface of a light-splitting and extracting part of the optical probe 1 or 4 and an outer surface of the electro-optic material so as to absorb the incident light beam BM and hence to prevent the occurrence of light scattering.

In all of the embodiments described above, the tip of the electro-optic material is brought close to the object to be measured but not as close as to make contact with this object. If desired, the tip of the electro-optic material may be held in contact with the object of interest during voltage detection.

What is claimed is:

1. A voltage detector for detecting a voltage developing in a selected area of an object to be measured, comprising:
    a light source for emitting a light beam;
    a voltage-sensing part including reflection means for reflecting an input light beam, and an electro-optic material for sensing said voltage in said object in the form of a change of a refractive index thereof and for converging said input light beam;
    splitting and extracting means for extracting a light beam with a first predetermined polarized component from said light beam introduced from said light source which is launched into said electro-optic material as said input light beam, and extracting an output light beam with a second predetermined polarized component from an output light beam emerging from said electro-optic material after reflecting from said reflection means; and
    detection means for determining said voltage developing in said selected area of said object on the basis of intensity of said output light beam with said second predetermined polarized component.

2. A voltage detector as claimed in claim 1, wherein said splitting and extracting means further splits said light beam with said first predetermined polarized component into a reference light beam and said input light beam which is launched into said electro-optic material; and
    said detection means determines said voltage on the basis of intensity of said reference light beam and intensity of said output light beam with said second predetermined polarized component.

3. A voltage detector as claimed in claim 1, wherein said input light beam is changed at a light-incidence boundary surface of said electro-optic material.

4. A voltage detector as claimed in claim 3, wherein said light-incidence boundary surface of said electro-optic material is worked into a convex shape and converges said input light beam on a reflection surface of said reflection means.

5. A voltage detector as claimed in claim 1, wherein
said electro-optic material has a graded refractive index profile in which said refractive index profile is substantially symmetric to a plane including a central axis of said electro-optic material and said refractive index monotonously decreases from said symmetric plane, and said input light beam is linearly converged on a reflection surface of said reflection means; and
said detection means comprises a streak camera for detecting said output light beam with said second predetermined polarized component, and lens means for linearly converging said output light beam with said second predetermined polarized component on a photocathode of said streak camera.

6. A voltage detector as claimed in claim 5, wherein said graded refractive index profile is formed as a result of ion diffusion.

7. A voltage detector for detecting a voltage developing in a selected area of an object to be measured, comprising:
a light source for emitting a light beam;
a voltage-sensing part including reflection means for reflecting a launched input light beam, and an electro-optic material for sensing said voltage in said object in the form of a change of a refractive index thereof and for changing a light beam path, in which a refractive index profile of said electro-optic material is substantially axially symmetric with a central axis of said electro-optic material as a symmetric axis and said refractive index monotonously decreases from said symmetric axis;
splitting means for splitting an output light beam emerging from said electro-optic material after reflecting from said reflection means into a signal light beam and other light beam; and
detection means for determining said voltage developing in said selected area of said object on the basis of intensity of said signal light beam.

8. A voltage detector as claimed in claim 7, wherein
said splitting means further splits said light beam introduced from said light source into a reference light beam and said input light beam which is launched into said electro-optic material; and
said detection means determines said voltage on the basis of intensity of said reference light beam and intensity of said signal light beam.

9. A voltage detector as claimed in claim 7, wherein said refractive index profile is formed as a result of ion diffusion.

10. A voltage detector for detecting a voltage developing in a selected area of an object to be measured, comprising:
a light source for emitting a light beam;
a voltage-sensing part including reflection means for reflecting an input light beam, and an electro-optic material for sensing said voltage in said object in the form of a change of a refractive index thereof and for converging said input light beam;
splitting and extracting means for extracting a light beam with a first predetermined polarized component from said light beam, introducing said extracted light beam into said electro-optic material as said input beam, for extracting an output light beam with a second predetermined polarized component from an output light beam emerging from said electro-optic material after reflection from said reflection means, said splitting and extracting means further for splitting said light beam with said first predetermined polarized component into a reference light beam and said input light beam; and
detection means for determining said voltage developing in said selected area of said object on the basis of the intensity of said referenced light beam and the intensity of said output light beam with said second predetermined polarized component.

11. A voltage detector for detecting a voltage developing in a selected area of an object to be measured, comprising:
a light source for emitting a light beam;
a voltage sensing part including reflection means for reflecting an input light beam, and an electro-optic material for sensing said voltage in said object in the form of a change of a refractive index thereof and for converging said input light beam at a light-incident boundary surface of said electro-optic material;
splitting and extracting means for extracting a light beam with a first predetermined polarized component from said light beam, for introducing said extracted light beam into said electro-optic material as said input light beam, and for extracting an output light beam with a second predetermined polarized component from an output light beam emerging from said electro-optic material after reflecting from said reflection means; and
detection means for detecting said voltage developing in said selected area of said object on the basis of the intensity of said output light beam with said second predetermined polarized component.

12. A voltage detector as claimed in claim 11, wherein said light incident boundary surface of said electro-optic material has a convex shape and converges said input light beam on a reflection surface of said reflection means.

13. A voltage detector for detecting a voltage developing in a selected area of an object to be measured, comprising:
a light source for emitting a light beam;
a voltage-sensing part including reflection means for reflecting an input light beam, and an electro-optic material for sensing said voltage in said object in the form of a change of a refractive index thereof and for converging said input light beam, said electro-optic material having a graded refractive index profile substantially symmetrical to a plane including a central axis of said electro-optic material and monotonical decreasing from said symmetric plane such that said input light beam is linearly converged on a reflection surface of said reflection means;
splitting and extraction means for extracting a light beam with a first predetermined polarized component from said light beam, for introducing said extracted light beam into said electro-optic material as said input light beam, and extracting an output light beam with a second predetermined polarized component from an output light beam emerging from said electro-optic material after reflection from said reflection means; and detection means for determining said voltage developing in said selected area of said object on the basis of the intensity of said output light beam with said second predetermined polarized component, said detection means comprising a streak camera for detecting said output light beam with said second predetermined polarized component and a lens means for linearly converging said output light beam with said second predetermined component on a photocathode of said streak camera.

14. A voltage detector as claimed in claim 13, wherein said graded refracted index is formed as a result of ion defusion.

* * * * *